(12) United States Patent
Nuttgens

(10) Patent No.: US 11,467,204 B2
(45) Date of Patent: Oct. 11, 2022

(54) TESTING AN INTEGRATED CAPACITOR

(71) Applicant: SEMTECH CORPORATION, Camarillo, CA (US)

(72) Inventor: Jonah Edward Nuttgens, Ashurst Southampton (GB)

(73) Assignee: SEMTECH CORPORATION, Camarillo, CA (US)

( * ) Notice: Subject to any disclaimer, the term of this patent is extended or adjusted under 35 U.S.C. 154(b) by 20 days.

(21) Appl. No.: 16/949,069

(22) Filed: Oct. 13, 2020

(65) Prior Publication Data

US 2022/0113346 A1 Apr. 14, 2022

(51) Int. Cl.
*G01R 31/12* (2020.01)
*G01R 31/27* (2006.01)
*G01R 31/64* (2020.01)
*G01R 31/26* (2020.01)
*H01L 49/02* (2006.01)

(52) U.S. Cl.
CPC ....... *G01R 31/275* (2013.01); *G01R 31/2639* (2013.01); *G01R 31/64* (2020.01); *H01L 28/40* (2013.01)

(58) Field of Classification Search
CPC .. G01R 31/64; G01R 31/275; G01R 31/2639; G01R 27/2605; G01D 5/24; G01D 5/2403
See application file for complete search history.

(56) References Cited

U.S. PATENT DOCUMENTS

| | | | | |
|---|---|---|---|---|
| 8,040,142 B1* | 10/2011 | Bokma | .............. | G01R 27/2605 324/658 |
| 8,415,957 B2* | 4/2013 | Huang | .................. | H03K 17/962 324/658 |
| 10,101,862 B2* | 10/2018 | Borgmann | ........... | H03K 17/962 |
| 2008/0312857 A1* | 12/2008 | Sequine | ............. | G01R 31/2829 702/65 |
| 2010/0181180 A1* | 7/2010 | Peter | .................... | H03K 17/955 200/5 R |
| 2012/0204540 A1* | 8/2012 | Gonze | ................... | F01N 3/2013 60/274 |
| 2019/0113554 A1* | 4/2019 | Sieg | ................... | G01R 27/2605 |
| 2019/0319086 A1 | 10/2019 | Ainsworth | | |
| 2020/0220543 A1* | 7/2020 | Chang | .................. | H03K 17/962 |

* cited by examiner

*Primary Examiner* — Thang X Le
(74) *Attorney, Agent, or Firm* — Alston & Bird LLP

(57) ABSTRACT

Circuitry for testing an integrated capacitor that includes a first capacitor, a supply node for connecting to a voltage supply, a test node for connecting to the integrated capacitor, and a charge monitoring circuit. The circuitry is operable in a sequence of states including a first state in which the first capacitor is connected to the supply node and is disconnected from the test node so as to charge the first capacitor to a test voltage and a second state in which the first capacitor is disconnected from the supply node and is connected to the test node to apply the test voltage to the integrated capacitor. The charge monitoring circuit is configured to monitor a charge transfer from the first capacitor to the integrated capacitor in said second state and to generate a measurement value based on an amount of the charge transfer.

17 Claims, 6 Drawing Sheets

TESTING AN INTEGRATED CAPACITOR

TECHNICAL FIELD

The present disclosure is related to apparatus and methods for testing an integrated capacitor and, in particular, for testing an integrated capacitor to detect a defect associated with the integrated capacitor.

BACKGROUND

Integrated circuits (ICs) are used in a variety of applications to perform a wide variety of functions and operations. Such ICs are formed from semiconductor materials and may be implemented with a variety of electrical components such as transistors, resistors, capacitors etc.

In general it may be desirable to integrate as much of the circuitry as possible, to reduce or avoid the need for separate discrete electrical components, with the associated cost and size implications. However, for some applications, it may previously have been impractical to achieve some required electrical properties with integrated components and thus some discrete components may have been used with the IC. In particular, for some applications, discrete capacitors were used.

It is known that integrated capacitors may be formed from one or more layers of interdigitated electrodes. It has been proposed that such an approach can allow formation of capacitors with relatively high capacitance values and/or operable at relatively high voltages, without requiring an unacceptable amount of circuit area and, in particular, this may allow for operating an integrated capacitor at much higher voltage than would normally be found in an IC fabricated in a modern high-performance technology.

US patent publication US2019/0319086A1 describes one example of an integrated capacitor which may be formed from a plurality of interdigitated fingers of conductive material. The properties of the capacitor are such that it can be used as a relatively high voltage capacitor. This document describes one particular useful implementation, where, as part of an optical receiver, an avalanche photodiode (APD) may be operated with a relatively high voltage supply and the signal from the APD may be input to a transimpedance amplifier (TIA) circuit, which is implemented as an IC and which operates at a lower voltage to the APD. A high voltage capacitor integrated with the TIA circuit can be used as part of a filter or local decoupling for the high voltage supply, thus avoiding the need for a discrete capacitor, as had previously been used.

FIG. 1a and FIG. 1b illustrate perspective and plan views respectively of the structure of an integrated capacitor 100 formed from interdigitated electrodes. The integrated capacitor comprises a first electrode 110 and a second electrode 120. Each electrode is formed of an electrically conductive material. The first electrode 110 comprises a first plurality of fingers 112-116 that are parallel to one another and joined together at one end by a track or terminal of the electrode 110. The second electrode 120 likewise has a corresponding second plurality of fingers 122-126 that are parallel to the first plurality of fingers 112-116 and which are connected to one another at the opposite end to the first plurality of fingers. The fingers 112-116 of the first electrode are arranged interleaved with the fingers 122-126 of the second electrode, and are separated by a dielectric material. The first electrode 110 thus forms a first capacitor plate and the second electrode forms a second capacitor plate, the two plates being separated by the dielectric. It will be understood that a practical implementation may contain a much larger number of fingers than illustrated, which may possibly be arranged in more complex patterns, and/or may comprise multiple layers of interdigitated electrodes stacked on top of one another to maximize the area efficiency of the structure.

Referring to FIG. 1b, an important parameter in the design of the integrated capacitor structure 100 is the minimum spacing d between the electrodes, e.g. between adjacent fingers of the two electrodes. The spacing d may be determined for a given capacitor based on a compromise between capacitance area density and safe working voltage. Particularly in IC processes containing low-permittivity dielectric materials, the maximum allowable electric field strength may be the limiting factor in determining the minimum spacing in the integrated capacitor 100 structure, and therefore the achievable capacitance value per unit of area. FIG. 1b also illustrates the electric field lines between first electrode 110 and second electrode 120, as would be expected in use.

One issue that can impact such integrated capacitors is any manufacturing defects that result in a variation in the intended spacing d between the different electrodes. As will be understood by one skilled in the art, occasionally defects can occur during manufacturing, for instance dust particles or other defects in the lithographic fabrication process can result in malformation in part of a deposited metal layer. Depending on the required capacitance value, the integrated capacitor may, in some instances, occupy a significant proportion of the total IC die area and thus the integrated capacitor may be statistically more likely to be affected by a processing defect.

FIG. 2 illustrates a plan view of an integrated capacitor 200, similar to capacitor 100 discussed with reference to FIGS. 1a and 1b (and where similar elements are identified by the same reference numerals), but which includes a defect.

FIG. 2 illustrates a malformation or defect 230 of part of conductive finger 222 of the second electrode 220. As noted above, such a defect may occur in the manufacture of the capacitor 200 due to a defect in the lithographic fabrication process. The defect 230 may cause a localized reduction in distance between the electrodes 210, 220, resulting in increased electric field strength at this location when voltage is applied across the capacitor 200 in operation.

The localized increased electric field strength resulting from such a defect can be problematic as it may, in use, cause increased leakage current at this location, with a consequential impact on the operation of the circuit. Additionally or alternatively the increased electric field strength experienced in use may result in premature failure of the capacitor 200 due to the Time-Dependent Dielectric Breakdown (TDDB) phenomenon.

It would therefore be desirable to be able to test an integrated capacitor, for example to detect the presence of a defect that may impact on operation or lifespan of the integrated capacitor, especially if the capacitor occupies a significant proportion of the chip area. Additionally or alternatively it may also be desirable to be able to measure the capacitance of the device, to ensure compliance to the stated product specifications and to monitor the consistency of the fabrication process.

Generally IC testing is typically automated, using relatively standard automated testing equipment (ATE), so as to enable high throughput. It would be desirable for any testing of an integrated capacitor to be compatible with conventional automated testing for ICs.

SUMMARY

Embodiments of the present disclosure relate to methods and apparatus for testing an integrated capacitor, in particular to detecting a defect associated with an integrated capacitor.

According to a first aspect of the present disclosure there is provided circuitry for testing an integrated capacitor. The circuitry comprises: a first capacitor, a supply node for connecting to a voltage supply, a test node for connecting to the integrated capacitor and a charge monitoring circuit. The circuitry is operable in a sequence of states comprising: a first state in which the first capacitor is connected to the supply node and is disconnected from the test node so as to charge the first capacitor to a test voltage and a second state in which the first capacitor is disconnected from the supply node and is connected to the test node to apply the test voltage to the integrated capacitor. The charge monitoring circuit is configured to monitor a charge transfer from the first capacitor to the integrated capacitor in said second state and to generate a measurement value based on an amount of the charge transfer.

In some examples the circuitry may further comprise a first switch for selectively connecting the first capacitor to the supply node in the first state and connecting the first capacitor to the test node in the second state. In some examples the circuitry may further comprise a second switch for selectively connecting the test node to a defined voltage node in the first state and disconnecting the test node from the defined voltage node in the second state. In some examples, the circuitry may further comprise a relay comprising the first switch and the second switch.

In some examples the charge monitoring circuit may comprise an integrator coupled to the first capacitor such that, in the second state, the first capacitor is in series between the test node and the integrator. In some examples, the integrator may comprise an operational amplifier and an integrator capacitor and wherein the circuitry may further comprise a third switch configured to discharge the integrator capacitor. In some examples, the circuitry further comprises one or more diodes connected between the integrator input node and a reference voltage. In some examples, the integrator input node may be connected to the first capacitor via a resistive element.

In some examples the circuitry may be configured as an interface between an integrated circuit to be tested and automated testing equipment.

In a second aspect there is provided a method of testing an integrated capacitor of an integrated circuit. The method comprises operating testing circuitry in a first state to charge a first capacitor to a test voltage; subsequently operating the testing circuitry in a second state to connect the first capacitor to the integrated capacitor so as to charge the integrated capacitor to the test voltage and monitoring charge transfer from the first capacitor to the integrated capacitor in said second state and generating a measurement value based on an amount of said charge transfer.

In some examples of the method, in the second state, a first plate of the first capacitor may be coupled to the integrated capacitor and monitoring the charge transfer from the first capacitor to the integrated capacitor may comprise integrating a current that flows as a result of charge transfer to a second plate of the first capacitor.

In some examples the method may further comprise, after switching from the first state to the second state, determining from said measurement value, an indication of the amount of charge transferred from the first capacitor to the integrated capacitor when charging the integrated capacitor to the test voltage. In some examples the method may further comprise determining an indication of capacitance of the integrated capacitor from said indication of the amount of charge transferred from the first capacitor to the integrated capacitor when charging the integrated capacitor to the test voltage.

In some examples the method may further comprise, after switching from the first state to the second state, maintaining the testing circuitry in a second state for an integration period and determining an amount of change of the measurement value over the integration period. In some examples the method may further comprise determining an indication of leakage current based on the amount of change of the measurement value over the integration period. In some examples the method may further comprise identifying a fault with the integrated capacitor when the indication of leakage current exceeds a defined threshold.

In some examples the method may further comprise testing another part of the integrated circuit during the integration period.

In some examples of the second aspect the test voltage may be greater than a nominal operating voltage rating of the integrated capacitor.

In some examples of the second aspect the integrated circuit is a transimpedance amplifier circuit and the integrated capacitor is configured as at least part of a filter for a voltage supply.

According to a third aspect there is provided an apparatus for testing an integrated capacitor of an integrated circuit. The apparatus comprises: a first capacitor, a first switch operable in a first state to couple a first plate of the first capacitor to a voltage supply node and operable in a second state to couple the first plate of the first capacitor to the integrated capacitor via a test node and an integrator with an integrator input coupled to a second plate of the first capacitor.

BRIEF DESCRIPTION OF THE DRAWINGS

To better explain various embodiments and examples of the present disclosure and the principles, example implementation and operation thereof, reference will now be made, by way of example, to the following drawings, in which.

DETAILED DESCRIPTION

Embodiments of the present disclosure relate to methods and apparatus for testing an integrated capacitor, for example to determine the capacitance of the integrated capacitor and/or determine a defect of the integrated capacitor.

As discussed above, it would be desirable to be able to test an integrated capacitor in a way which is compatible with standard IC automated testing equipment (ATE), so the testing can be readily implemented as part of a manufacturing process.

Figure 1A:
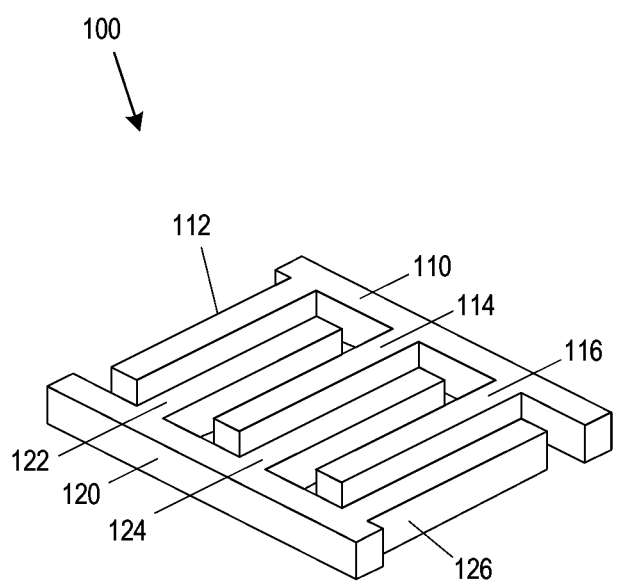
FIG. 1a and FIG. 1b illustrates an example of an integrated capacitor in perspective and plan view, respectively.
Figure 1B:
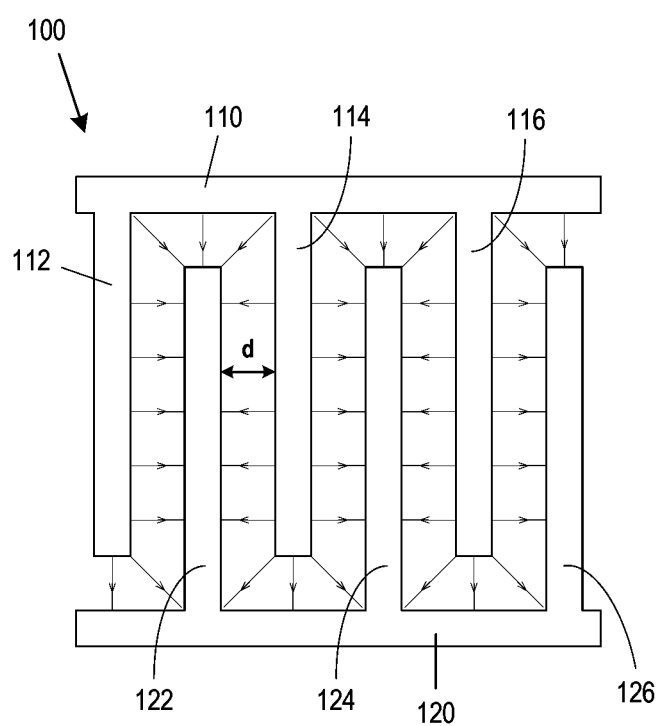
Figure 2:
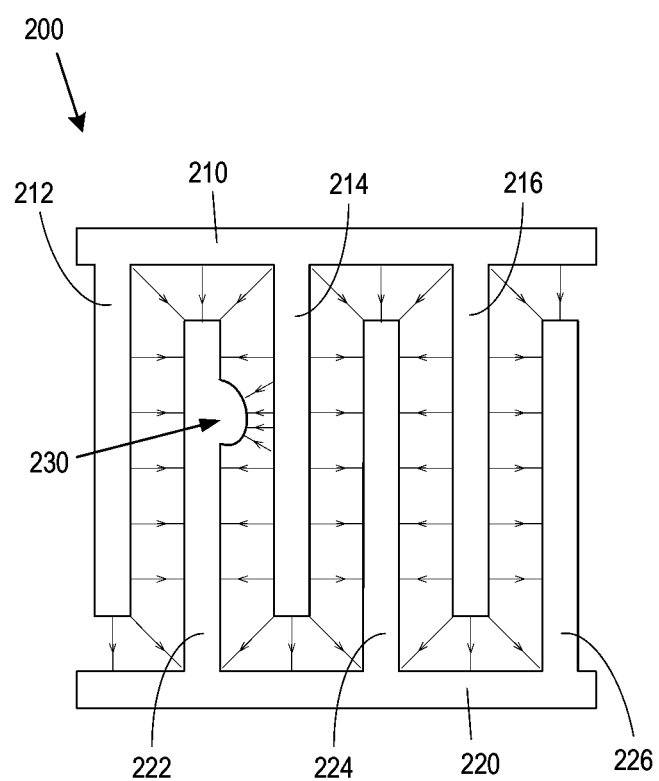
FIG. 2 illustrates a plan view of an example of an integrated capacitor comprising a defect.

One method of testing an integrated capacitor could consist of simply measuring its resistance, which would expected to be practically infinite for a sample that does not comprise a defect. However, the ATE conventionally used for IC testing generally applies relatively low voltages and has limited resistance sensing resolution. Whilst such resistance testing using conventional ATE equipment may be able to detect "gross" defects that are significant enough to cause a short circuit between the electrodes of the capacitor, such testing would not be able to detect more minor defects such as defect 230 illustrated in FIG. 2 which result in a detrimental increase in electric field strength in use, but do not result in a complete short circuit.

An additional issue for testing at least some integrated capacitors is that access to the integrated capacitor in the IC will depend on the circuit arrangement with respect to the accessible terminals of the IC. In the example described in US2019/0319086A1, one terminal of the integrated capacitor is coupled to an internal ground node, which also connects to multiple other components of the IC, and thus the relevant terminal of the integrated capacitor is not independently accessible by the testing equipment. It would therefore desirable for the testing to be able to test an integrated capacitor which has one terminal coupled to ground, or some other defined reference voltage, with only one terminal independently accessible.

Embodiments according to the present disclosure operate to apply a test voltage to an integrated capacitor of a device under test and measure charge transfer to the integrated capacitor. The test voltage may, in particular, be a relatively high voltage. Application of a relatively high test voltage to the integrated capacitor results in a relatively large magnitude electric field in the dielectric insulator of the capacitor, which can cause a leakage current in the capacitor due to Poole-Frenkel emission and/or quantum tunneling effects. These effects produce a leakage current that is exponentially dependent on the electric field strength. Therefore any reduction in spacing between the electrodes, such as from defect 230 illustrated in FIG. 2, which results in a higher electric field strength may cause a disproportionate increase in leakage current. Application of a relatively high test voltage to the capacitor may therefore expose any significant deficiency in insulator thickness/electrode spacing.

Defects causing a severe reduction in insulator, i.e. dielectric, thickness may be provoked into instantaneous breakdown due to the excessive electric field strength when the high test voltage is applied, while less severe defects may be observed as an abnormally high value of leakage current. This testing process may also detect abnormalities of types other than defect 230, such as chemical contamination of the dielectric, microscopic cracks, lithographic alignment errors, or ESD damage, amongst others. The detection of an anomalous value of leakage current, may indicate an abnormality in the structure of the capacitor, which leads to reduced performance of the capacitor and/or reduced operating lifetime.

The test voltage which is applied may thus be sufficiently high to stress the capacitor, e.g. to cause leakage current effects, at least in a defective capacitor. The test voltage may, in some instances be above the normal expected operating voltage range of the integrated capacitor, and may, in some instance be relatively close to a breakdown voltage of the device. However the test voltage is not so high as to damage a non-defective integrated capacitor, i.e. is below a safe operating threshold for a healthy device.

Detection of a leakage current when the capacitor is subject to such a test voltage can therefore indicate the presence of defects. However, the magnitude of the leakage current may typically be small, for instance of the order of nanoamps. In addition, if only one terminal of the integrated capacitor is accessible, e.g. because the other capacitor terminal is grounded within the IC, then the test voltage must be applied and any leakage current detected using the same terminal. Conventional ATE equipment does not typically have the resolution required to measure such small currents, and/or may not have the capability to generate sufficiently high test voltages. In embodiments of the present disclosure, once the integrated capacitor is charged to the test voltage, any further charge transfer to the integrated capacitor can be monitored over time, for instance using an integrator, which thus allows the total amount of charge transfer over time to be determined and used to provide an indication of the amount of any leakage current, and hence an indication of the presence of any defects. Additionally, the amount of charge transferred whilst charging the integrated capacitor up to the test voltage will depend on the capacitance of the integrated capacitor, and can be monitored to provide an indication of the capacitance of the integrated capacitor.

Embodiments according to the present disclosure may therefore increase the reliability of integrated capacitors through improved testing which allows defective devices to be rejected.

Figure 3:
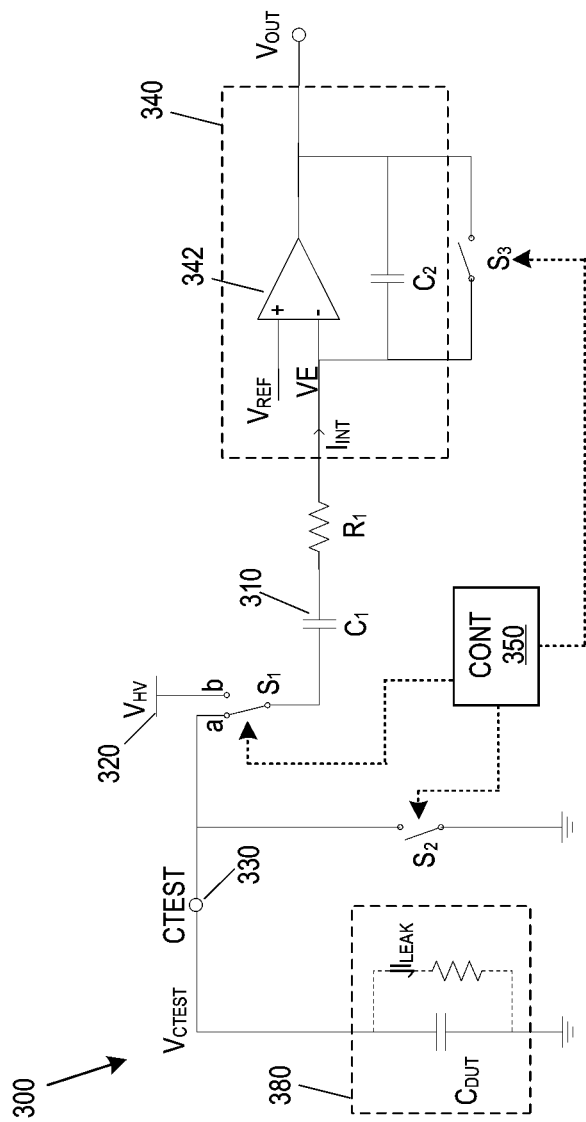
FIG. 3 illustrates an example of circuitry for testing an integrated capacitor according to an embodiment.

FIG. 3 illustrates one example of testing circuitry 300 for testing an integrated capacitor $C_{DUT}$ according to an embodiment.

Circuitry 300 comprises a first capacitor 310 ($C_1$), a supply node 320 for connecting to a supply voltage $V_{HV}$ and test node 330 (CTEST) for connecting to an integrated capacitor $C_{DUT}$ to be tested. The circuitry also includes a charge monitoring circuit 340 and, in this example, a controller 350.

In use, the supply node 320 is configured to receive a voltage $V_{HV}$. As will be described in more detail below, the voltage $V_{HV}$ received via the supply node may be used to charge the first capacitor $C_1$ which is then used to provide the test voltage. The voltage $V_{HV}$ may thus define the test voltage which is applied by the first capacitor. In some embodiments the voltage $V_{HV}$ may be a relatively high voltage, e.g. of the order of tens of volts or so. In one example the voltage $V_{HV}$ may be in the range 50-100V or so. In some embodiments, the circuitry 300 may comprise a suitable voltage source for generating the voltage $V_{HV}$. Alternatively, the supply node 320 may be, in use, be connected to an external voltage supply for supplying high voltage $V_{HV}$.

In use, the test node 330 will be coupled to the integrated capacitor $C_{DUT}$ of the device under test (DUT) 380, i.e. the IC comprising the integrated capacitor $C_{DUT}$. The test node 330 is thus operatively coupled to a relevant terminal of the IC 380 to be tested, e.g. via some suitable contact probe as will be understood by one skilled in the art.

Circuitry 300 may, in some embodiments, be implemented as an interface between automated test equipment (ATE) and the relevant DUT 380, i.e. the IC comprising the integrated capacitor $C_{DUT}$ to be tested. As one skilled in the art will be familiar, testing of ICs typically use ATE to provide for a high throughput of testing ICs. The circuitry may, for instance, be implemented on a test load board interfacing between the DUT and the ATE. For testing the integrated capacitor, the test node 330 may be coupled to a terminal or contact of the IC that is electrically coupled, within the IC, to an electrode of the integrated capacitor $C_{DUT}$. As noted above in at least some examples the other electrode or plate of the integrated capacitor may be internally grounded within the IC.

The testing circuitry 300 further comprises first switch $S_1$ operable to selectively connect the first capacitor $C_1$ to either supply node 320 or test node 330. As will be described in more detail below, the controller 350 may operate the first switch $S_1$ to sequence between a first state in which the first capacitor 310 is coupled to the supply node 320 to charge the first capacitor 310 to the supply voltage $V_{HV}$, and a second state in which the first capacitor $C_1$ is connected to the test node 330 so as to apply the test voltage to the integrated capacitor. It will be understand that switch $S_1$ may, in practice, be implemented by an arrangement of more than one switching elements such as transistors or the like, and a reference herein to a switch shall be taken to include an arrangement of such switching elements.

Circuitry 300 also comprises second switch $S_2$, which is configured to selectively connect the test node 330 to a defined voltage node, which in the illustrated embodiment of FIG. 3, comprises a ground node. As will be described in more detail below, second switch $S_2$ may be controlled, in use, by the controller 350 to selectively discharge the integrated capacitor $C_{DUT}$ (or otherwise set the voltage of the integrated capacitor $C_{DUT}$ to the defined voltage), for instance before application of the test voltage.

In the example of FIG. 3, the testing circuitry 300 includes controller 300 operable to control the circuit in the various operating states. In some implementations, however, suitable control signals may be generated externally and received from the external controller, e.g. from or via the ATE apparatus.

Circuitry 300 further comprises charge monitoring circuit 340 configured to monitor charge transfer from first capacitor $C_1$ to integrated capacitor $C_{DUT}$ and to output a signal $V_{OUT}$ indicative of the amount of charge transfer. Charge monitoring circuit 340, in this embodiment, comprises an active integrator circuit coupled to the first capacitor $C_1$ such that, in the second state, the first capacitor is in series between the test node and the integrator. The integrator comprises operational amplifier 342 and integrator capacitor $C_2$. Op-amp 342 is configured to receive a defined reference voltage $V_{REF}$ at its non-inverting input and its inverting input is coupled to the first capacitor $C_1$.

As one skilled in the art will understand, the node VE at the inverting input of op-amp 342 is a virtual earth (VE), and any current $I_{INT}$ applied to this VE node is integrated by the op-amp 442. The output signal from the integrator is given by $V_{OUT}$=integral $(-I_{INT}/C_2)dt$.

In operation, when the circuitry 300 is in the second state with the first capacitor connected to the test node 330, and hence to the integrated capacitor $C_{DUT}$, the principle of charge conservation means that any charge transferred from one plate of the first capacitor $C_1$ (the left-hand plate as illustrated) to the integrated capacitor $C_{DUT}$ will result in an equal transfer of charge to the other plate of the first capacitor $C_1$ (the right-hand plate as illustrated). This will result in a current at the input to the integrator 340, which as discussed above, will integrate the current to provide an output signal $V_{OUT}$ related to the total amount of charge transferred. In this configuration, the output signal $V_{OUT}$ may therefore be considered a measurement value indicative of the amount charge transfer from first capacitor $C_1$ to the integrated capacitor $C_{DUT}$.

Circuitry 300 further comprises a third switch $S_3$, which may be selectively operated to reset the active integrator circuit by shorting the plates of the integrator capacitor $C_2$ so as to reset the voltage across the integrator capacitor $C_2$ to zero. With third switch $S_3$ closed, the output signal $V_{OUT}$ is nominally equal to the reference voltage $V_{REF}$. $V_{REF}$ may be a stable reference voltage, which may be chosen to ensure that the output signal $V_{OUT}$ from the integrator stays within the output voltage range specification of the op-amp 342. The op-amp 342 may comprise a very high input impedance, such as a FET-input type unit, so that the op-amp input current does not significantly interfere with the current $I_{INT}$ to be detected.

In some implementations, the testing circuitry 300 may comprise a resistive element $R_1$ located in the path between the first capacitor $C_1$ and the VE node of op-amp 342. The resistive element $R_1$ may be provided so as to limit the instantaneous peak current that flows in the circuitry 300, in particular when the switches $S_1$, $S_2$, $S_3$, change state. Resistive element $R_1$ may therefore prevent component damage and overload of the op-amp 342 that could otherwise occur. Resistive element $R_1$ does not substantially affect the operation performed by op-amp 442, however, it may introduce a settling time-constant following switching of switches $S_1$, $S_2$, $S_3$.

Figure 4:
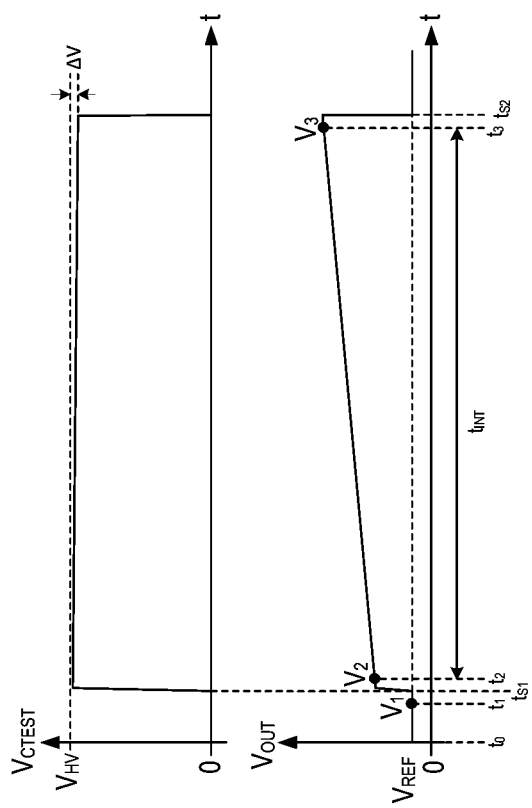
FIG. 4 illustrates example voltage waveforms resulting from the operation of circuitry for testing an integrated capacitor.

The circuit 300 for testing integrated capacitor $C_{DUT}$ may thus be operated in a series of states or phases, as will now be described with reference to the voltage waveforms illustrated in FIG. 4. FIG. 4 illustrates the voltage $V_{CTEST}$ at the test node, i.e. the voltage at the accessible terminal of the integrated capacitor $C_{DUT}$, and also the voltage output $V_{OUT}$ from the charge monitoring circuit, i.e. integrator 340.

At the start of the testing procedure, at a time $t_0$, the controller 350 may control the testing circuitry 300 to be in the first state, in which first switch $S_1$ is switched to position b as illustrated, second switch $S_2$ is closed and third switch $S_3$ is also closed. In this first state, the first switch $S_1$ connects the first capacitor $C_1$ to the supply node 320, which therefore charges first capacitor $C_1$ to the supply voltage $V_{HV}$. The second switch $S_2$ in the closed position connects the integrated capacitor $C_{DUT}$ of the DUT 380 to ground, therefore discharging the integrated capacitor $C_{DUT}$, should any charge be present across the integrated capacitor $C_{DUT}$. As described above, the third switch $S_3$ being closed resets the active integrator, i.e. the charge monitoring circuit 340.

At a time $t_1$, which allows for sufficient time $t_0$ the first capacitor $C_1$ to be fully charged by the voltage supply $V_{HV}$ and any transients to settle, the output signal $V_{OUT}$ from the integrator 340 may be sampled, e.g. by the ATE, to provide a first voltage reading $V_1$. At this point the output signal $V_{OUT}$ should be substantially equal to the reference voltage $V_{REF}$ and therefore $V_1 \sim V_{REF}$. The first reading $V_1$ may be used as a reference value in subsequent processing steps.

At time $t_{S1}$, the controller 350 may reconfigure the testing circuitry 300 to the second state, by controlling first switch $S_1$ to position a and opening both second switch $S_2$ and third switch $S_3$. The first switch $S_1$ thus couples the first capacitor $C_1$ to the test node and hence to the integrated capacitor $C_{DUT}$ of the DUT 380. As the integrated capacitor $C_{DUT}$ is initially discharged, the charge stored on the first capacitor $C_1$ is thus redistributed between first capacitor $C_1$ and the integrated capacitor $C_{DUT}$ in proportion to their respective capacitances. This in turn causes the voltage $V_{CTEST}$ at the test node to rise, such that $V_{CTEST}=V_{HV}*C_1/(C_1+C_{DUT})$. The supply voltage $V_{HV}$ from supply node 420 is chosen, allowing for the value of the capacitance of the first capacitor $C_1$ and the approximate expected value of $C_{DUT}$, so that the magnitude of the voltage $V_{CTEST}$ at the test node after this initial charge redistribution is sufficient to stress the integrated capacitor $C_{DUT}$ as discussed above. The capacitance of the first capacitor $C_1$ can be selected to be much greater than that of the integrated capacitor $C_{DUT}$ and thus, in practice, the integrated capacitor $C_{DUT}$ may be initially charged to a value which is substantially at or near to the value of the supply voltage $V_{HV}$. As described above, the supply voltage $V_{HV}$ may be greater than the normal rated voltage of the integrated capacitor $C_{DUT}$, in order to sufficiently stress the integrated capacitor $C_{DUT}$ to expose any defects in the insulator, but lower than the breakdown voltage of a healthy specimen of the integrated capacitor $C_{DUT}$. FIG. 4 thus illustrates that at the time $t_{S1}$, when the circuitry 300 transitions from the first state to the second state, the voltage $V_{CTEST}$ at the test node thus quickly rises to be substantially equal to the voltage of the capacitor $C_1$ which was charged to the supply voltage $V_{HV}$.

At time $t_2$ a second reading $V_2$ may be taken of the output signal $V_{OUT}$ from integrator 340, e.g. by the ATE. The time interval between $t_{S1}$ and time $t_2$ may be governed by the settling time constant due to the resistive element $R_1$. In some embodiments, the settling constant may be relatively short e.g. <1 ms.

The quantity of charge transferred from first capacitor $C_1$ to integrated capacitor $C_{DUT}$ in the charge redistribution process is given by the formula $Q=C_{DUT}*V_{CTEST}$, where Q is the quantity of charge, $C_{DUT}$ is the capacitance of the integrated capacitor and $V_{CTEST}$ is the voltage to which the integrated capacitor is charged. As noted above, due to conservation of charge, any charge flowing from the first capacitor $C_1$ to integrated capacitor $C_{DUT}$ is balanced by an equal quantity of charge flowing to the opposite plate of the first capacitor $C_1$. The amount of charge transferred from first capacitor $C_1$ to integrated capacitor $C_{DUT}$ is monitored and detected by the active integrator circuit, resulting in a change in output signal $V_{OUT}$ equal to $C_{DUT}*V_{CTEST}/C_2$. By comparing the second reading $V_2$ with the first reading and knowing the values of capacitance of the integrator capacitor $C_2$ and the voltage $V_{CTEST}$ (e.g. taken to be equal to $V_{HV}$), the capacitance of the integrated capacitor $C_{DUT}$ can be calculated as $C_{DUT}=(V_2-V_1)*C_2/V_{CTEST}$.

Thus, in some implementation a value of the capacitance for the integrated capacitor $C_{DUT}$ could be determined based on the amount of charge transferred. In some implementations a downstream processor may be configured to determine the capacitance of the integrated capacitor $C_{DUT}$ based on the second reading $V_2$. In some instances a value for the capacitance could be calculated, based on the difference between the first and second readings $V_1$ and $V_2$ and the known value of voltage $V_{HV}$ and integrator capacitance $C_2$. In some cases, however, where the reference voltage $V_{REF}$ is known in advance the second reading $V_2$ may simply be used with a look-up table or similar to determine the capacitance value. In some instances the value of the second reading $V_2$ (or the difference $V_2-V_1$) may simply be compared to one or more expected values that would be expected if the integrated capacitor had the correct capacitance, so as to identify any problems.

The testing circuitry may then be maintained in the second state for a period of time before, at time $t_3$, taking a third reading $V_3$ of the output signal $V_{OUT}$. The period between $t_2$ and $t_3$ may be referred to as the integration period $t_{INT}$. During the integration period $t_{int}$, any leakage current $I_{LEAK}$ in the DUT 380 may cause further charge to be drawn from first capacitor $C_1$. Any leakage current $I_{LEAK}$ in the DUT 380, will cause the voltage $V_{CTEST}$ to decay, but if the leakage current $I_{LEAK}$ is sufficiently small, and the capacitance of the first capacitor $C_1$ is relatively large, then the resulting voltage drop $\Delta V$ of the voltage $V_{CTEST}$ may be quite small and may be considered insignificant.

However, over the integration period $t_{INT}$, the leakage current LEAK is approximately equal to $-I_{INT}$, due to charge conservation as explained above. The response of the integrator 340 over the integration period $t_{INT}$ thus causes the output voltage $V_{OUT}$ to increase at a rate proportional to the leakage current $I_{LEAK}$.

Therefore, following a sufficient integration period $t_{INT}$ (which may be, for example, approximately 1 second or so for some implementations), a third measurement $V_3$ of the output voltage $V_{OUT}$ is made. The change in the output voltage $V_{OUT}$ over the integration period $t_{INT}$, i.e. $V_3-V_2$, is equal to $-I_{INT}*t_{int}/C_2$, which is approximately equal to LEAK $t_{int}/C_2$.

By selecting an appropriate capacitance value for the integrator capacitor $C_2$ and allowing an appropriate integration time $t_{INT}$, even small values of leakage current, e.g. of the order of nanoamps, can lead to a change in voltage of $V_{OUT}$ that is readily detectable and, for instance, accurately measurable with the resolution afforded by conventional ATE apparatus.

As noted above, in some implementations a suitable integration period may be of the order of a second or so. During this period other testing could be performed on the DUT 380. Where the testing circuit is used with ATE apparatus, the ATE may be configured to perform other testing operations on the DUT 380 during the integration period $t_{INT}$. By allowing such concurrent testing, the integration period $t_{INT}$ may not significantly extend the total run-time of the testing operations performed on the DUT 380. For instance, in the example where the DUT includes a transimpedance amplifier, some testing could be performed on the TIA circuitry during the integration period.

The variation in voltage of the output signal $V_{OUT}$ over the integration period, i.e. $V_3-V_2$, can be used as, or to determine, an indication of leakage current. In some instances, where the duration of the integration period and the value of the integrator capacitor are fixed, the variation in the output signal may be $V_3-V_2$ used itself as the indication of leakage current. In some implementations, however, a value for the leakage current $I_{LEAK}$ may be determined as the indication of leakage current, e.g. a value for the leakage current $I_{LEAK}$ may be calculated by some downstream processor from the second voltage reading $V_2$ and third voltage reading $V_3$, knowing the integration period $t_{int}$ and the capacitance value of second capacitor $C_2$.

The indication of leakage current can be used to determine the quality the integrated capacitor $C_{DUT}$ i.e. whether the integrated capacitor $C_{DUT}$ comprises a defect or not. For example, the indication of leakage current may be compared to a defined threshold value to determine if the integrated capacitor $C_{DUT}$ has a defect or not. If the indication of leakage current is below the threshold value, it may be determined that the integrated capacitor $C_{DUT}$ does not comprise any significant defect. However, if the indication of leakage current is above the threshold value, it may be determined that the integrated capacitor $C_{DUT}$ does comprise a defect.

Referring again to FIG. 4, at time $t_{S2}$, the controller 350 may control switch $S_2$ to connect the integrated capacitor $C_{DUT}$ to ground so that it is discharged at the end of the test.

In some instances the circuit may be controlled to adopt the first state, with first capacitor $C_1$ is connected to the supply node 420 and charged to the high voltage $V_{HV}$ and the op-amp 442 is reset with third switch $S_3$ in the closed position. The DUT 380 may then be replaced by a second DUT, i.e. the ATE make contact with a second DUT to be tested and the circuitry 300 may then perform the testing operation, as described above, on an integrated capacitor of the second DUT.

The testing circuitry 300 is thus capable of testing an integrated capacitor to determine a value of, or related to, the capacitance of the integrated capacitor, which allows for checking the integrated capacitor is within specification. Problems with an individual device or batch can thus be identified. The testing circuitry 300 is additionally or alternatively capable of allowing identification of defects that may degrade the long-term reliability of the integrated capacitor.

Figure 5:
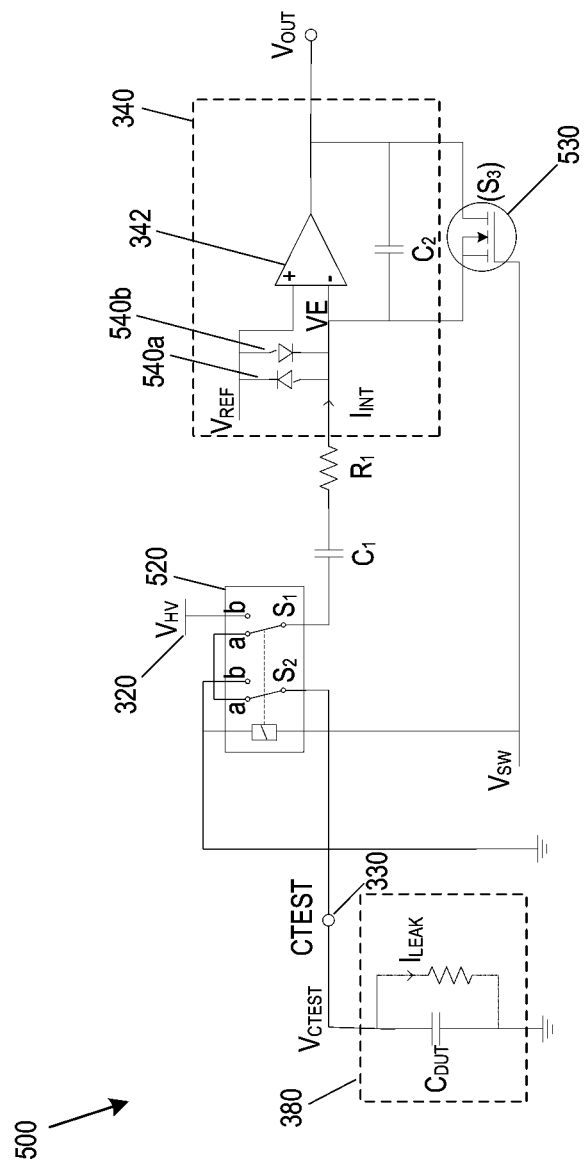
FIG. 5 illustrates another example of circuitry for testing an integrated capacitor according to an embodiment.

FIG. 5 illustrates another example of circuitry 500 for testing an integrated capacitor, but which illustrates an example of how the circuit may be implemented in more detail.

In the example of FIG. 5, the first switch $S_1$ and second switch $S_2$ may be implemented by a relay 520, which in this example is a Double Pole Double Throw (DPDT) relay. Third switch $S_3$ may comprise a MOSFET 530.

In this example a common switch control signal $V_{SW}$ may be used to control the first, second and third switches $S_1$, $S_2$ and $S_3$. In this example the switch control signal may be received from an external controller, e.g. from connected ATE apparatus, although the circuit could include a switch controller in some embodiments.

In the example of FIG. 5, the charge monitoring circuit 340, i.e. the integrator, further comprises a pair of anti-parallel diodes 540a, 540b, coupled between the input node VE of the op-amp 342 and the reference voltage. The anti-parallel diodes 540a, 540b, are provided to limit the voltage range of the VE node, so as to prevent damage to the op-amp 342 in the case of excessive charge transfer through the first capacitor $C_1$. It will be understood that other arrangements are possible, however, and in general one or more diodes may be provided to limit the voltage range of the VE node.

Excessive charge transfer through the first capacitor $C_1$, may occur in the case of a defective integrated capacitor $C_{DUT}$ having excessively high leakage current $I_{LEAK}$ or, in another example, from a defect causing a short. Defects such as these may cause the output signal $V_{OUT}$ to rise rapidly during the integration period $t_{INT}$, and the op-amp 342 may saturate resulting in the loss of control of the VE node. Further charge transfer beyond the point of saturation may then cause the voltage on the virtual earth node VE to shift, until it is clamped by one of the diodes 540a, 540b. A similarly large transfer of charge in the opposite direction may occur upon subsequent re-charging of first capacitor $C_1$, or indeed upon initial power-up of the circuit, when the circuitry 500, in which case the other one of the diodes 540a, 540b will prevent excessive swing of the virtual earth VE node in the other direction.

Embodiments of the present disclosure therefore provide circuitry for testing an integrated capacitor. The circuitry may determine whether the integrated capacitor comprises a defect or not based on monitoring an amount of charge transfer over time, so as to provide an indication of abnormal amount of leakage current. Such testing provides for increased reliability of the integrated capacitor as faulty samples may be identified that comprise "soft" defects, which do not result in a short, but may still impact on performance and/or reliability. The circuitry may also determine the capacitance of the integrated capacitor, which can additionally improve the reliability or quality of the manufacturing by verifying that the capacitance corresponds to its specified rating.

Testing circuitry according to embodiments of the present disclosure can conveniently be implemented to be compatible with ATE, for instance on a test load board that serves as an interface between ATE and a DUT. The testing circuitry can determine the capacitance of the integrated capacitor and/or whether the integrated capacitor comprises a defect in a relatively quick and efficient manner, without substantially affecting other testing procedures. As discussed above conventional ATE would not typically be able to monitor currents of small magnitudes (~nA), such as the leakage current resulting from applying a high voltage to the integrated capacitor. By monitoring charge transferred to the integrated capacitor over time, e.g. with an active integrator, testing circuitry according to embodiments of the present disclosure can provide output signals that are within the resolution and input range parameters ATE and associated testing equipment.

Testing circuitry according to embodiments of the present disclosure can also provide testing of an integrated capacitor where only one terminal of the integrated capacitor is independently accessible. By charging a capacitor of the test circuit to the test voltage, an then monitoring charge transfer from that capacitor, the same terminal of the IC can be used to both apply the test voltage and monitor the leakage current.

The testing circuitry may be used to test a variety of different type of integrated capacitor in a variety of different integrated circuits. The test circuitry may, in particular be used to test an integrated capacitor where one terminal of the integrated capacitor is permanently connected to ground within the IC comprising the integrated capacitor. The integrated capacitor may be a high voltage capacitor, i.e. may have a voltage rating greater than the rest of the integrated circuit. The test circuitry may, in particular be used to test an integrated capacitor which is integrated with a TIA circuit. The integrated capacitor may be arranged as at least part of a filter.

It will be understood that the examples and embodiments described above are given by way of example only and those skilled in the art will understand that modifications, variations, additions or alterations may be made to specific embodiments described, or alternative embodiments may be implemented, without departing from the scope of the appended claims.

It should be noted that as used herein, unless expressly stated otherwise, the word "comprising" does not exclude the presence of other elements or steps other than those listed, references to an element or feature in the singular does not exclude the possibility of a plurality of such elements or features, and that recitation of different features or elements in the appended claims does not necessarily imply separate components; a single component or unit may fulfil the function of several elements recited in a claim. Any reference signs in the appended claims shall not be construed so as to limit their scope.

The invention claimed is:

1. Circuitry for testing an integrated capacitor, the circuitry comprising:
   a first capacitor;
   a supply node for connecting to a voltage supply;
   a test node for connecting to the integrated capacitor; and a charge monitoring circuit,
  wherein the circuitry is operable in a sequence of states comprising:
    a first state in which the first capacitor is connected to the supply node and is disconnected from the test node so as to charge the first capacitor to a test voltage,
    a second state in which the first capacitor is disconnected from the supply node and is connected to the test node to apply the test voltage to the integrated capacitor, and
  wherein the charge monitoring circuit is configured to monitor a charge transfer from the first capacitor to the integrated capacitor in said second state and to generate a measurement value based on an amount of the charge transfer, and wherein the charge monitoring circuit comprises an integrator coupled to the first capacitor such that, in the second state, the first capacitor is in series between the test node and the integrator.

2. The circuitry according to claim 1 further comprising a first switch for selectively connecting the first capacitor to the supply node in the first state and connecting the first capacitor to the test node in the second state.

3. The circuitry according to claim 1 further comprising a second switch for selectively connecting the test node to a defined voltage node in the first state and disconnecting the test node from the defined voltage node in the second state.

4. The circuitry according to claim 3 further comprising a relay comprising the first switch and the second switch.

5. The circuitry according to claim 3 wherein the integrator comprises an operational amplifier and an integrator capacitor and wherein the circuitry further comprises a third switch configured to discharge the integrator capacitor.

6. The circuitry according to claim 3 further comprising one or more diodes connected between the integrator input node and a reference voltage.

7. The circuitry according to claim 3 wherein the integrator input node is connected to the first capacitor via a resistive element.

8. The circuitry according to claim 1 wherein the circuitry is configured as an interface between an integrated circuit to be tested and automated testing equipment.

9. A method of testing an integrated capacitor of an integrated circuit comprising:
  operating testing circuitry in a first state to charge a first capacitor to a test voltage;
  subsequently operating the testing circuitry in a second state to connect the first capacitor to the integrated capacitor so as to charge the integrated capacitor to the test voltage;
  after switching from the first state to the second state, maintaining the testing circuitry in a second state for an integration period;
  determining an amount of change of the measurement value over the integration period;
  determining an indication of leakage current based on the amount of change of the measurement value over the integration period; and
  monitoring charge transfer from the first capacitor to the integrated capacitor in said second state and generating a measurement value based on an amount of said charge transfer.

10. A method as claimed in claim 9 wherein, in the second state, a first plate of the first capacitor is coupled to the integrated capacitor and monitoring the charge transfer from the first capacitor to the integrated capacitor comprises integrating a current that flows as a result of charge transfer to a second plate of the first capacitor.

11. A method as claimed in claim 9 comprising, after switching from the first state to the second state, determining from said measurement value, an indication of the amount of charge transferred from the first capacitor to the integrated capacitor when charging the integrated capacitor to the test voltage.

12. A method as claimed in claim 11 comprising determining an indication of capacitance of the integrated capacitor from said indication of the amount of charge transferred from the first capacitor to the integrated capacitor when charging the integrated capacitor to the test voltage.

13. A method as claimed in claim 12 comprising identifying a fault with the integrated capacitor if the indication of leakage current exceeds a defined threshold.

14. A method as claimed in claim 12 comprising testing another part of the integrated circuit during the integration period.

15. A method as claimed in claim 9 wherein the test voltage is greater than a nominal operating voltage rating of the integrated capacitor.

16. A method as claimed in claim 9 wherein the integrated circuit is a transimpedance amplifier circuit and the integrated capacitor is configured as at least part of a filter for a voltage supply.

17. Apparatus for testing an integrated capacitor of an integrated circuit, the apparatus comprising:
  a first capacitor,
  a first switch operable in a first state to couple a first plate of the first capacitor to a voltage supply node and operable in a second state to couple the first plate of the first capacitor to the integrated capacitor via a test node; and
  an integrator with an integrator input coupled to a second plate of the first capacitor.

* * * * *